United States Patent
Franciarini et al.

(10) Patent No.: US 7,449,743 B2
(45) Date of Patent: Nov. 11, 2008

(54) CONTROL GATE PROFILE FOR FLASH TECHNOLOGY

(75) Inventors: Stefano Montironi Franciarini, Naas co. Kildare (IE); Dorotea Arcidiacono, Naas co. Kildare (IE)

(73) Assignee: Intel Corporation, Santa Clara, CA (US)

( * ) Notice: Subject to any disclaimer, the term of this patent is extended or adjusted under 35 U.S.C. 154(b) by 405 days.

(21) Appl. No.: 11/063,020

(22) Filed: Feb. 22, 2005

(65) Prior Publication Data

US 2006/0189073 A1  Aug. 24, 2006

(51) Int. Cl.
*H01L 29/76* (2006.01)
(52) U.S. Cl. .................. 257/314; 438/257; 365/185

(58) Field of Classification Search .............. 257/314, 257/316, 321, 322; 438/257, 261; 365/185
See application file for complete search history.

(56) References Cited

U.S. PATENT DOCUMENTS

| 5,115,288 | A  | * | 5/1992  | Manley  | 257/316 |
| 6,462,372 | B1 | * | 10/2002 | Wu      | 257/314 |
| 2003/0197219 | A1 | * | 10/2003 | Kim et al. | 257/316 |

* cited by examiner

*Primary Examiner*—Phuc T. Dang
(74) *Attorney, Agent, or Firm*—Kacvinsky LLC

(57) ABSTRACT

A nonvolatile memory device has a floating gate and a control gate. The floating gate incorporates a substantially vertical profile and provides the charge storage mechanism to set a specific threshold voltage. The control gate incorporates a sloped profile to enhance reliability.

10 Claims, 2 Drawing Sheets

CONTROL GATE PROFILE FOR FLASH TECHNOLOGY

Flash memory devices are a special type of memory that can be erased and reprogrammed and used to store code and/or data in a single data storage component. Flash memory chips find use in a variety of applications that include storing the Basic Input/Output System (BIOS) in PCs, updating new protocols in modems, installing user-friendly features in cellular phones and providing security to guard against erroneous code.

These applications require flash memory devices that have high levels of endurance, reliability and data retention and perform for a predictable length of time without failure. One reliability concern for the flash memory devices is an Infant Cycling Failure (ICF). Any charge gain or loss caused by defects in either the charge storage material or select gate oxide may compromise data integrity. The undesired defects may be introduced in the numerous manufacturing steps that include depositions, cleaning, etches and resist removal. New processes are needed to reduce the defect density in the memory devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
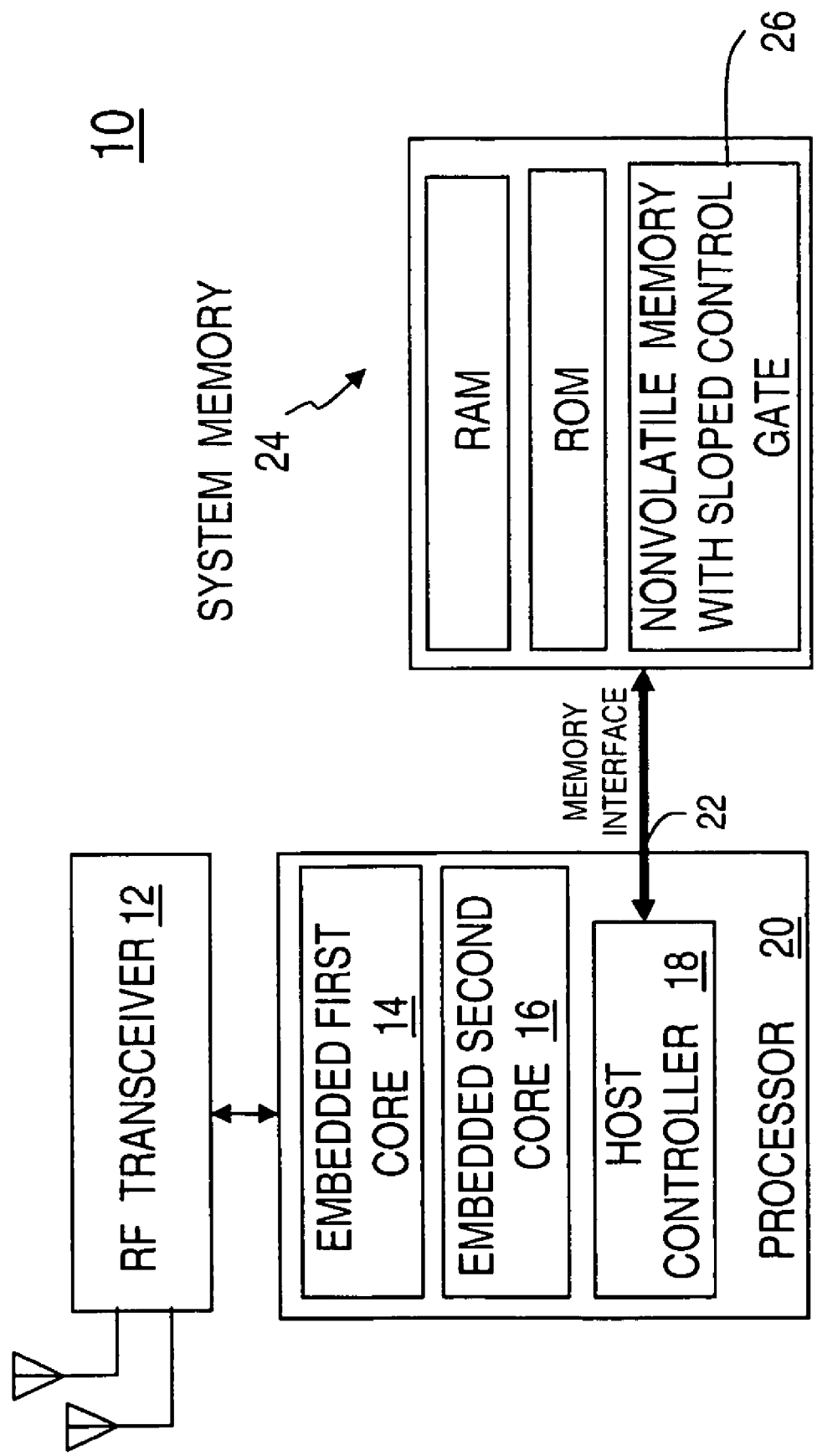
FIG. 1 is a block diagram illustrating a wireless device that incorporates nonvolatile memory with a sloped control gate in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

FIG. 1 illustrates features of the present invention that may be incorporated, for example, into a device 10. In the embodiment shown, device 10 is a wireless communications device, but it should be pointed out that the present invention is not limited to wireless applications. In this embodiment a transceiver 12 both receives and transmits a modulated signal from one or more antennas. The analog front end transceiver may be a stand-alone Radio Frequency (RF) integrated analog circuit, or alternatively, be embedded with a processor 20 as a mixed-mode integrated circuit. The received modulated signal may be frequency down-converted, filtered, then converted to a baseband, digital signal.

Processor 20 may include baseband and applications processing functions that utilize one or more processor cores. Blocks 14 and 16, in general, process functions that fetch instructions, generate decodes, find operands, and perform appropriate actions, then store results. The use of multiple cores may allow one core to be dedicated to handle application specific functions such as, for example, graphics, modem functions, etc. Alternatively, the multiple cores may allow processing workloads to be shared across the cores.

A host controller 18 controls a memory interface 22 that exchanges data with a system memory 24. System memory 24 may include a combination of memories such as a disc, a Random Access Memory (RAM), a Read Only Memory (ROM) and a nonvolatile memory 26, although the type or variety of memories included in system memory 24 is not a limitation of the present invention. Nonvolatile memory 26 may be an Electrically Erasable and Programmable Read Only Memory (EEPROM), a flash memory or any other memory having a control gate and floating gate that is capable of storing instructions and/or data and retaining that information even with device 10 in a power conservation mode. In accordance with the present invention, nonvolatile memory 26 incorporates a sloped control gate.

As previously mentioned, processor 20 and nonvolatile memory 26 may be incorporated into a wireless device 10, but the processor and memory may be included together in applications other than wireless. Accordingly, embodiments of the present invention may be used in a variety of applications, with the claimed subject matter incorporated into desktop computers, laptops, mobile phones, MP3 players, cameras, communicators and Personal Digital Assistants (PDAs), medical or biotech equipment, automotive safety and protective equipment, and automotive infotainment products. However, it should be understood that the scope of the present invention is not limited to these examples.

Figure 2:
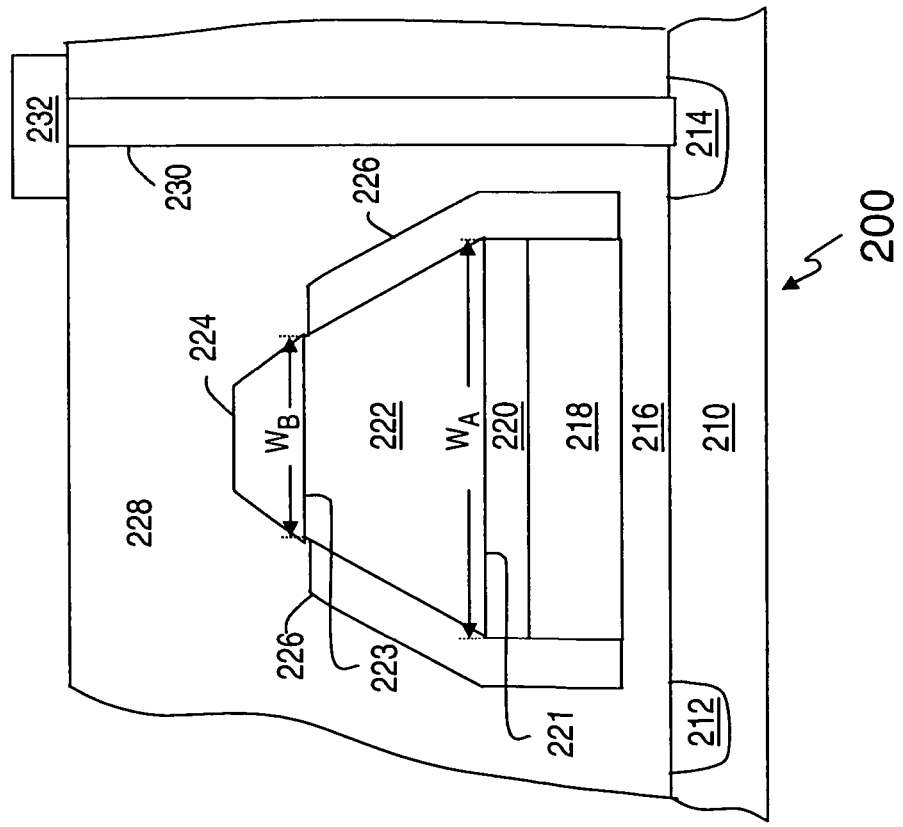
FIG. 2 is a cross-sectional side view of a nonvolatile memory cell that shows the sloped control gate.

FIG. 2 illustrates one embodiment of a nonvolatile memory cell 200 that may be instantiated multiple times and arrayed in nonvolatile memory 26. Once arrayed, the large memory may be sectored into smaller blocks that may be programmed and erased using on-chip algorithms. Further, the present embodiment provides a structure amenable to the Multi-Level Cell (MLC) that includes multiple bits per memory cell. Note that the various embodiments of the present invention are not limited with respect to the configuration of the arrays, the type of algorithms used for programming and erasing the memory cells or by the number of bits stored in a single memory cell.

Memory cell 200 employs a flash memory process that may have several wells (not shown for simplicity), double layers of polysilicon and multiple metal layers (only one metal layer is shown for simplicity) based on a CMOS process. The architecture of memory cell 200 is adapted for embedded logic capability with low voltage and high performance requirements. The single transistor developed in this technology may be a NOR-type cell with separate drain and source lines for each column, or alternatively, a NAND-type cell.

A tunnel oxide 216 is grown on a substrate 210 as a thin, low-defect oxide which separates floating gate 218 from its silicon interface. Floating gate 218 may have a thickness of about 800 angstroms (Å). A control gate 222 having a thickness of about 2000 Å is formed above, but isolated from, the floating gate 218 by an interpoly dielectric 220 which in this embodiment is a stacked film of silicon dioxide-silicon nitride-silicon dioxide (ONO). Note that interpoly dielectrics other than ONO may be used in memory cell 200 without detracting from the present invention.

A reliability concern is the contact-to-gate spacing of flash memory cells, a concern that is addressed by the present invention. In accordance with the present invention control gate 222 is formed with a sloped profile that increases the contact-to-gate spacing. In the figure this is illustrated in the cross sectional view of memory cell 200 where a width $W_A$ at a surface 221 is shown to be greater than a width $W_B$ at a surface 223. In this embodiment, width $W_A$ ranges from 210 to 220 nanometers (nms) and width $W_B$ ranges from 190 to 200 nms, although the upper and lower values of $W_A$ and $W_B$ may differ in other embodiments without detracting from the present invention. The sloped profile provides an average width delta of 20 nanometers (nm) from the bottom to the top of control gate 222, i.e., $W_A-W_B$ is about 20 nm.

The slope of control gate 222 may be determinant upon the dry etch process that is used to define/etch the control gate. The etch process may be a dry etch, i.e., an etch through a plasma, that may be changed by controlling the amount of gases used in the etch process. The type of plasma used in the etch process may help determine the slope of the poly in control gate 222.

Upon forming the sloped profile for control gate 222, that polysilicon gate may be silicided to reduce the wordline resistance by providing a sheet resistance that is lower than that of a conventional polysilicon gate. If a silicide is desired in memory cell 200, that silicide may be a metal selected from group IVA, VA, and group VIII metals. In the embodiment shown in the figure, a cobalt salicide ($CoSi_2$) 224 is self-aligned to the control gate 222 by depositing a layer of blanket metal on the entire structure, followed by a silicide annealing. Silicide is formed, in principle, only where the metal is in contact with silicon.

A source region 212 and a drain region 214 for the transistor are formed in a substrate 210, where the diffused regions are in alignment with spacers 226 on either side of floating gate 218 and control gate 222. This self-aligned scheme allows a sub-lithographic poly space. Source region 212 may be a graded source diffusion to improve source/oxide junction breakdowns during a memory erase, although this is not a limitation of the present invention. The drain space may be larger than the source space due to the presence of a contact in the drain region.

A dielectric layer 228 isolates a metal layer 232 from the transistor gate structure in memory cell 200. Metal layer 232 carries bitline data to the sense amplifiers (not shown) and also routes voltage potentials to source region 212. A drain contact 230 allows metal layer 232 to electrically contact drain region 214. A nitride etch stop layer (not shown) may be deposited below the inter-layer-dielectric oxide to prevent the contact etch punching through the isolation and causing a short to substrate 210.

In operation, a single transistor in memory cell 200 may employ Fowler-Nordheim tunneling for both program and erase operations. In another embodiment, the single transistor cell may use Channel Hot-Electron (CHE) injection to control the charge placement. Whether Fowler-Nordheim tunneling or Channel Hot-Electron injection, the nonvolatile memory 26 architecture illustrated in FIG. 2 provides accurate charge placement and storage. Floating polysilicon gate 218 provides the charge storage mechanism to set a specific threshold voltage or Vt level. By setting voltage potentials on the source region and control gate, the operations of the flash cell and the souce-to-drain transistor conductivity are controlled.

For the embodiment where nonvolatile memory 26 includes MLC, the multiple Vt levels in memory cell 200 provide a technology suitable for storing multiple bits per flash memory cell. The amount of charge stored on the polysilicon floating gate categorizes the transistor to one of several different levels, with each level representing a range of threshold voltages. Thus, the electrical charge stored on the floating gate determines the precise Vt level that is programmed, and correspondingly, the stored logic value. By incorporating a substantially vertical profile on floating gate 218 and a sloped profile on control gate 222, the critical parameters of memory cell 200 remain substantially unchanged. Thus, parameters such as channel length, active area, gate and source coupling, drain coupling, source coupling, etc., remain substantially unaffected by the sloped profile on control gate 222.

Figure 3:
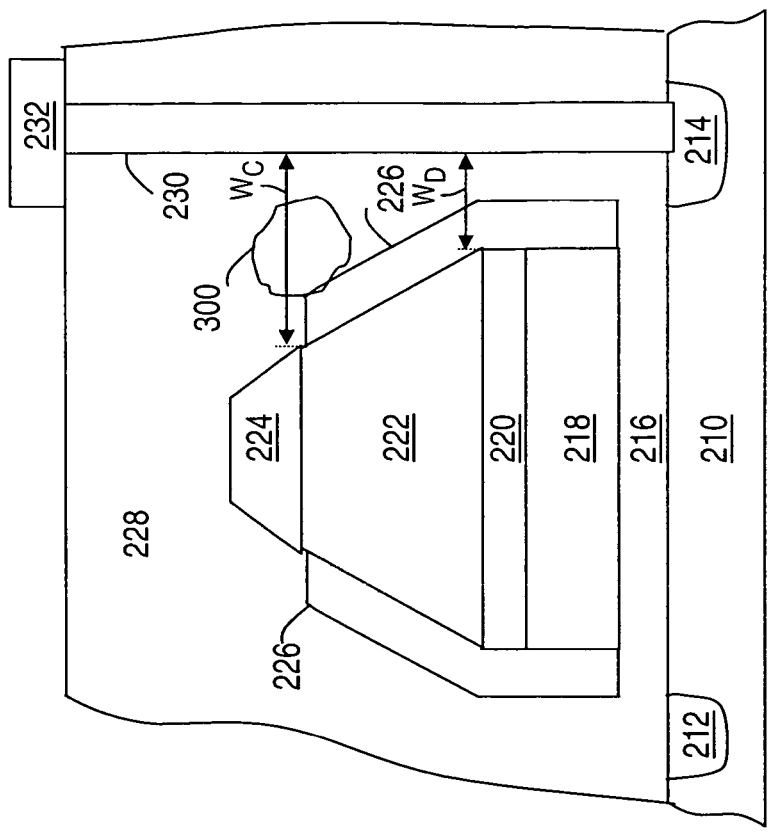
FIG. 3 is a cross-sectional side view of the nonvolatile memory cell that further shows the benefits of the sloped control gate in the presence of an undesired defect.

FIG. 3 is a cross-sectional side view of nonvolatile memory cell 200 that further shows the benefits of the sloped control gate in the presence of an undesired defect 300. In flash technologies the isolation of the flash transistor's control gate and floating gate from the drain contact and metal lines is a fundamental parameter. Any short between the two gate structures and the backend module, i.e., the drain contact and metal lines, is detrimental to memory device yields and reliability.

The figure illustrates a distance $W_D$ between the drain contact and control gate 222 that becomes increasingly smaller with layout shrinks. The prior art flash memory cells that has control gates with vertical profiles reach a limit as the distance $W_D$ is reduced. However, this embodiment that incorporates a sloped profile shows control gate 222 with and an increased contact-to-gate distance, where $W_C>W_D$. In the embodiment shown in the figure, the distance $W_C$ from the top edge of the control gate to the contact is about 10 nm greater than the distance $W_D$ which is from the bottom edge of the control gate to the contact. Note that the present invention is not limited to differences of only about 10 nm in the distance measurements and differences of more or less than 10 nm are envisioned. Also, the features of the present invention that provide a control gate with a sloped profile provide an advantage concerning layout shrinks.

Reliability failures for memory cell 200 may be based on defects and/or electrical stresses. Sloping control gate 222 provides advantages in device reliability. The increased contact-to-gate distance $W_C$ lowers chances of a contact-to-gate short that may be caused by defect 300. Additionally, the increased contact-to-gate distance $W_C$ increases the total dielectric thickness between the drain contact 230 and control gate 222 which lessens the effects of electrical stress. The sloped gate profile for control gate 222 increases the distance between control gate 222 and drain contact 230 without changing the overall poly dimension.

By now it should be apparent that the present invention enhances a nonvolatile memory cell by changing the profile of the control gate from a vertical profile to a sloped profile. Whereas the floating gate has a vertical profile due to charge retention issues, the control gate profile may be sloped to improve the technology robustness. The sloped poly profile for the control gate is applicable to flash technologies.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A nonvolatile memory device, comprising:
   a substrate;
   a first insulating layer over the substrate;
   a first semiconductor layer formed over the first insulating layer to provide a floating gate for the nonvolatile memory device;
   a second insulating layer over the first semiconductor layer; and
   a second semiconductor layer formed over the second insulating layer and above the floating gate to provide a control gate for the nonvolatile memory device, wherein a top width of the floating gate and a bottom width of the control gate substantially match, but a sloped profile of the control gate has a top width that is substantially less than the bottom width.

2. The nonvolatile memory device of claim 1 wherein the width at the top of the control gate ranges from 190 to 200 nms and the width at the bottom ranges from 210 to 220 nanometers (nms).

3. The nonvolatile memory device of claim 1 wherein the sloped profile provides an average width differential of about 20 nanometers (nm) from the top to the bottom of the control gate.

4. The nonvolatile memory device of claim 1 further including:
   a drain region in the substrate; and
   a contact to the drain region that is spaced apart from the control gate, where a distance from a top edge of the control gate to the contact is greater than a distance from a bottom edge of the control gate to the contact.

5. The nonvolatile memory device of claim 4 wherein the distance from the top edge of the control gate to the contact is about 10 nm greater than the distance from the bottom edge of the control gate to the contact.

6. The nonvolatile memory device of claim 1 wherein the second insulating layer is a stacked film of silicon dioxide-silicon nitride-silicon dioxide (ONO).

7. A flash memory comprising:
   a substrate;
   a first insulating layer over the substrate;
   a first polysilicon layer over the first insulating layer;
   a second insulating layer over the first polysilicon layer;
   a second polysilicon layer over the second insulating layer and in a plane above the first polysilicon layer that is etched to have a tapered profile where a top width is than a bottom width; and
   a drain region formed in the substrate and having a contact region on one side of the first and second polysilicon layers that have substantially matching surfaces adjacent to the second insulating layer.

8. The flash memory of claim 7 wherein the second polysilicon layer is a control gate having a sloped profile where the top surface edge is at least 5 nanometers (nm) further from the contact region than the bottom surface edge.

9. The flash memory of claim 7 wherein the first polysilicon layer is a floating gate having a vertical profile where the top surface edge and the bottom surface edge are substantially a same distance from the contact region.

10. The flash memory of claim 9 wherein a source region and the drain region are formed in the substrate where diffused regions are in alignment with spacers on either side of the first polysilicon layer that forms a floating gate and the second polysilicon layer that forms a control gate.

* * * * *

UNITED STATES PATENT AND TRADEMARK OFFICE
CERTIFICATE OF CORRECTION

PATENT NO. : 7,449,743 B2
APPLICATION NO. : 11/063020
DATED : November 11, 2008
INVENTOR(S) : Franciarini et al.

It is certified that error appears in the above-identified patent and that said Letters Patent is hereby corrected as shown below:

In column 6, line 17, in Claim 7, after "is" insert -- less --.

Signed and Sealed this

Sixteenth Day of March, 2010

David J. Kappos
*Director of the United States Patent and Trademark Office*